United States Patent [19]

Nuez et al.

[11] 4,298,401
[45] Nov. 3, 1981

[54] BREAKDOWN VOLTAGE RESISTOR OBTAINED THROUGH A DOUBLE ION-IMPLANTATION INTO A SEMICONDUCTOR SUBSTRATE, AND MANUFACTURING PROCESS OF THE SAME

[75] Inventors: Jean-Paul Nuez, Mennecy; Gerard Lebesnerais, Perthes en Gatinais, both of France

[73] Assignee: International Business Machines Corp., Armonk, N.Y.

[21] Appl. No.: 95,817

[22] Filed: Nov. 19, 1979

[30] Foreign Application Priority Data

Dec. 28, 1978 [FR] France .................................. 78 37092

[51] Int. Cl.³ ..................... H01L 3/22; H01L 21/265; H01L 29/90
[52] U.S. Cl. .................................... 148/1.5; 148/187; 357/13; 357/91
[58] Field of Search .................... 148/1.5, 187; 357/13, 357/91

[56] References Cited

U.S. PATENT DOCUMENTS

| | | | |
|---|---|---|---|
| 3,390,019 | 6/1968 | Manchester | 148/1.5 |
| 3,548,269 | 12/1970 | MacDougall et al. | 317/234 |
| 3,611,062 | 10/1971 | Rideout | 317/234 |
| 3,920,493 | 11/1975 | Kravitz | 148/187 |
| 3,947,866 | 3/1976 | Stellrecht | 357/51 |
| 4,104,085 | 8/1978 | Zandveld | 148/1.5 |
| 4,119,440 | 10/1978 | Hile | 148/1.5 |
| 4,125,415 | 11/1978 | Clark | 148/1.5 |
| 4,126,496 | 11/1978 | Verderber | 148/187 |
| 4,136,349 | 1/1979 | Tsang | 357/13 |
| 4,155,777 | 5/1979 | Dunkley et al. | 148/1.5 |

OTHER PUBLICATIONS

Zandveld, P., Solid St. Electronics, 19 (1976), 659.
Alcorn et al., IBM-TDB, 22 (Oct. 1979), 1973.
Lebesnerais et al., IBM-TDB, 20 (1974), 1471.
Putney, Z. C., "Simultaneous Formation of High Sheet Resistance...", IBM TDB, vol. 20, No. 10, Mar. 1978, pp. 4011–4012.

Primary Examiner—Upendra Roy
Attorney, Agent, or Firm—Joseph C. Redmond, Jr.

[57] ABSTRACT

An implanted resistor structure for semiconductor integrated circuit devices is formed by a double ion-implantation providing a high breakdown voltage resistor.

5 Claims, 8 Drawing Figures

BREAKDOWN VOLTAGE RESISTOR OBTAINED THROUGH A DOUBLE ION-IMPLANTATION INTO A SEMICONDUCTOR SUBSTRATE, AND MANUFACTURING PROCESS OF THE SAME

BACKGROUND OF THE INVENTION

Implanted integrated resistors are generally formed by implanting ions of a first type of conductivity into a monocrystal semiconductor substrate of the opposite type of conductivity. In this step, a region is formed which is parted from the substrate by a junction.

A junction is the surface (assumed flat, in a first approximation) which, in a semiconductor monocrystal, parts a region of a first type of conductivity from a contiguous region of the opposite type of conductivity. These semiconducting junctions have extremely important properties which are at the origin of the considerable development that the semiconductor integrated circuit technology knows at present.

In a conventional implementation, a silicon monocrystal body of p-type conductivity is coated with an epitaxial layer of n-type conductivity. A P-type region is formed in the epitaxial layer, through a masking layer of silicon dioxide having the required configuration, with the help of a diffusion or ion-implantation process. The p-type region, together with the epitaxial layer, forms a junction which can be utilized for many purposes such as a diode, a collector-base junction of a planar bipolar transistor, a drain region of an isolated gate filed effect transistor, etc.

In any case, whatever be the use of the junction, a paramount parameter, more specifically in the applications to analog integrated circuits, is the breakdown voltage of the junction when the latter is reverse-biased. This breakdown is an electrical phenomenon which, generally, is non-destructive. It is sometimes useful (Zener diodes) but, very often, it is a cause of limitation (or even of rejection) in the use of the device in some applications which require a high breakdown voltage.

The breakdown voltage of a junction $V_B$ depends on many factors, such as, for instance, doping of the contiguous regions, which are determinant of the electrical field in the space charge area. Physically, the breakdown effects result from the valence electrons being extracted from the crystal atoms by the carriers which are accelerated upon application of the electrical field. The so extracted and accelerated electrons, in turn, take part in extracting other electrons, thereby producing an avalanche effect which rapidly increases the reverse current in the junction.

When a junction is conventionally formed through a diffusion process carried out through a hole made in the masking layer of silicon dioxide, there is found a flat junction after redistribution of the dopant, which is formed under the aperture at a distance $x_j$ from the surface (where $x_j$ is the depth of the diffused junction); the dopant, however, is also spread under the masking layer at a distance equal to 0.8 $x_j$, so that the junction is slightly more cylindrical on its lateral sides, and slightly more spherical at its corners. This is the lateral diffusion effect which is well-known in the art. The electrical field in the space charge region is larger in the cylindrical or spherical portions of the junction than in the flat portion thereof so that the avalanche phenomenon occurs in the former for smaller voltages than in the later. The junction curvature, therefore, decreases the breakdown voltage upon avalanche effect. This very important phenomenon has been studied by Gibbons et al: Effects of Junction Curvatures on Breakdown Voltages in Semiconductors, Solid State Electronics Review, 1966, Vol. 9, pages 831 through 845. The authors have published tables of the values of the breakdown voltages for flat, cylindrical and spherical junctions, for both types of junctions, i.e., abrupt and gradual ones, and for different materials, namely, Ge, Si and GaAs.

The problem is identical in the case of a junction formed by ion-implantation when the sides of the opening made in the masking layer are inclined, which is the general case when the opening is formed by conventional etching steps. The teachings disclosed in the abovementioned literature, therefore, directly apply to implanted resitors.

The problem relative to the breakdown voltage in integrated resistors is of particular importance, not only in high current applications where breakdown voltages higher than 2000 volts are sought, but also in low current applications (logic circuits, memory circuits, analog circuits, . . .).

In high current applications, a conventional technique consists in making use of a field attenuation electrode; an example thereof is disclosed in French Pat. No. 71-26688 filed on July 21, 1971. This technique, as a matter of fact, comes to distort that portion of the depletion region which is in the substrate without modifying the shape of the metallurgical junction.

Such a solution requires space on the silicon surface, thereby reducing the integration density.

Another solution, which consists in modifying directly the shape of the junction, is disclosed in French Pat. No. 74-22656, filed on June 28, 1974. In this patent, which discloses an implanted resistor, a masking layer is used which is provided with a notch, which makes it possible to obtain an irregularly-shaped junction which, however, is conventional in the manufacturing of ion-implanted bipolar transistors.

This solution is relatively simple; however, it imperatively demands reoxidation of the silicon exposed in the aperture of the $SiO_2$ masking layer, and formation of a new photoresistive masking layer (in order to obtain the required masking configuration with the above-mentioned notch); in addition, this type of resistor does not make it possible to optimize both the temperature coefficient of the resistor (TCR) and the breakdown voltage thereof.

SUMMARY OF THE INVENTION

Therefore, a first object of this invention is to provide an implanted resistor manufacturing process wherein no additional masking step is necessary.

Another object of this invention is to provide for an implanted resistor manufacturing process which requires no extened substrate surface so that it is compatible with the high integration densities necessary in modern technologies.

Still another object of this invention is to provide an implanted resistor manufacturing process wherein the temperature coefficient and the breakdown voltage can be adjusted independently of each other.

This invention concerns a process of manufacturing an implanted resistor of high precision, low TCR and with an improved breakdown voltage, in a semiconductor substrate of a first type of conductivity, characterized in that it includes the following steps:

implanting impurities of a second type of conductivity opposite to the first type of conductivity into a defind region of the substrate, at a heavy dose within about $10^{12}$–$10^{15}$ at/cm$^2$, at a low energy within 20–120 KeV, in order to define the required value of the resistor and bring about a low TCR, implanting impurities of said second type of conductivity into the defined region, at a dose within about $10^{11}$–$10^{14}$ at/cm$^2$, i.e., a dose lighter than the heavy dose, and at a higher energy within about 120–400 KeV, in order to bring about an improved breakdown voltage without, however, substantially modifying the required value of the resistor, and annealing the substrate.

In a preferred embodiment, this heavy dose-light dose ratio is at least 10.

This invention also provides an implanted resistor structure of precise value, low TCR and high breakdown voltage, which includes a substrate of a first type of conductivity having a region in which said resistor, of a second type of conductivity opposite to the first type of conductivity, is embedded; the resistor structure being characterized in that this region is comprised of a first surface portion, which is shallow and highly doped, and of a second portion surrounding the first one, which is less doped and deeper, the latter portion defining the electrical junction between the region and the semiconductor substrate.

This invention concerns more particularly such a resistor structure, wherein said first potion is achieved through a first ion-implantation of an impurity of a second type of conductivity, at a low energy within about 20–120 KeV and a heavy dose within about $10^{12}$–$10^{15}$ at/cm$^2$, and said second portion is achieved through a second ion-implantation of said second type of conductivity, at a higher energy within 120–400 KeV, and a lighter dose of about $10^{11}$–$10^{14}$ at/cm$^2$.

In a preferred embodiment, the dose ratio will be chosen so as to be at least equal to 10.

This invention will be further explained by way of a non limiting example with reference to the accompanying drawings:

PREFERRED EMBODIMENT OF THE INVENTION

Figure 1:
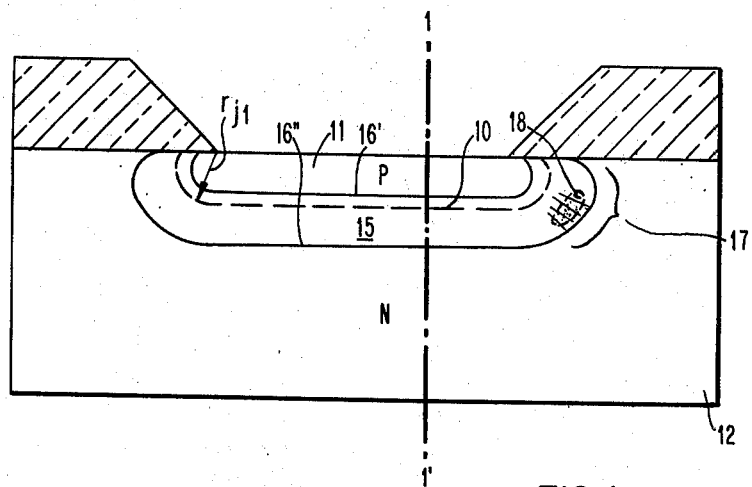
FIG. 1 is a sectional view of a prior art PN junction formed through a diffusion or ion-implantation step.

FIG. 1 illustrates a conventional structure comprising a PN-junction 10, formed between a P-type region 11 and and epitaxial N-type layer 12. As a rule, this layer is laid upon a semiconductor support, or substrate (not shown in the drawing).

Region 11, can, for instance, be formed upon implantation of ions of boron through an aperture made in the masking layer of silicon dioxide. When junction 10 is reverse biased, there is developed on each side, a depletion region or space charge region 15 the borders of which are indicated by lines 16' and 16". This depletion region, which has been deprived of minority and majority mobile carriers, has an electrical field induced by the fixed charges in this region, these charges are positive in that portion of the depletion region which is laying in the epitaxial layer 12, and negative in that portion which is laying in the P-type region 11. The intensity of this electrical field is increased with respect to the applied reverse voltage. The depletion region contains a curved potion 17 in which the electrical field shown by the flux lines 18, becomes high as reverse voltage is increased. Generally, the junction is borken in the curved portion, the curvature radius of this curved portion ($r_{j1}$), therefore, is determinant of the value of the breakdown voltage.

Figure 2:
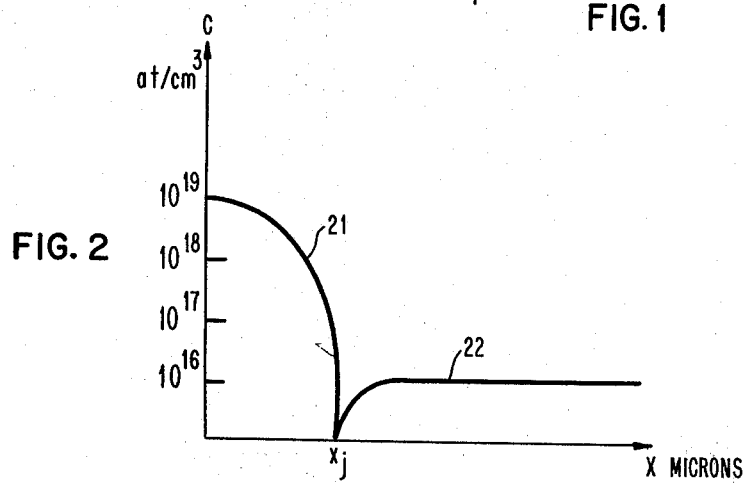
FIG. 2 shows the profile of the concentration (C) with respect to the depth (x) along line 1-1' of FIG. 1.

FIG. 2 shows curves 21 and 22 which respectively illustrate the concentrations of regions 11 and 12 with respect to depth x, along line 1—1". In order to comply with the ever increasing miniaturization and rates, the tendency is, at present, to try to obtain thinner and thinner epitaxial layers (a thickness in the order of one micron, even less) which, therefore, imply very thin resistive regions. This inventive process is compatible with these modern technologies.

Although this invention generally applies to an improved junction, the following description will more particularly deal with a very thin implanted resistor wherein the breakdown voltage problem is particularly acute.

As a rule, in the implementation of such a very thin resistor formed by implanting P-type ions into an N-type epitaxial layer, the technician who is conceiving the circuit and wishes to have a resistor with the lowest temperature coefficient (TCR), must utilize a low energy implantation because, this way, the dopant surface concentration is higher which, as it is well known, leads to a smaller TCR. This conventional process, with which it is possible to obtain very precise resistors of high value and low TCR, then, has the above-mentioned drawback, namely, the thin implanted layer has a small curvature radius and, therefore, a poor breakdown voltage.

The fundamental purpose of this invention is to provide for a process which maintains the required resistivity while providing an improved breakdown voltage; since this process is based on a double ion-implantation, it makes it possible to adjust separately the parameters: resistance and TCR, on the one hand, and breakdown voltage on the other hand.

With an additional masking step, it is possible, with this process, to obtain junctions having different breakdown voltages on the same semiconductor substrate. This implementation is particularly advantageous in applications to analog circuits in order to protect an amplifier against overvoltages, for instance. The breakdown may happen in the resistor proper, and not in the protected component.

Figure 3:
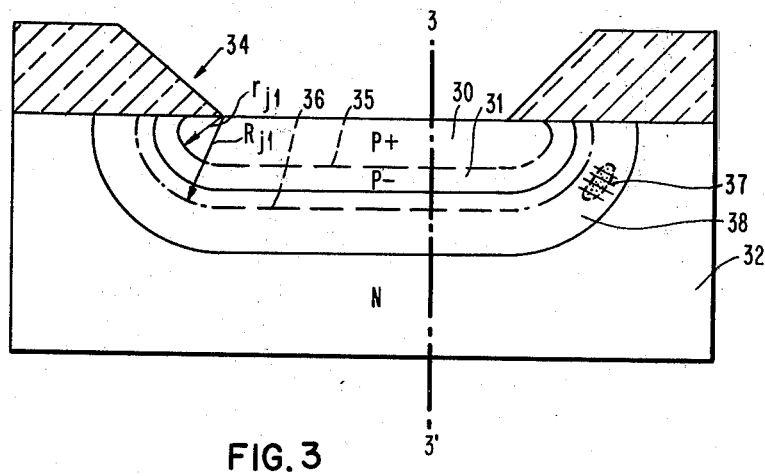
FIG. 3 is a sectional view of PN junction formed by double ion-implantation according to this invention.

FIG. 3 illustrates a junction which is achieved through a double P-type ion-implantation with different doses and energies, which implantation forms regions 30 and 31, of the P+ and P− -types, respectively, in the N-type epitaxial layer 32.

Conventionally, a masking layer of SiO2 is formed which has an aperture 34 made at the required location. A first ion-implantation is carried out with ions of the P-type, such as boron ions, at a heavy dose within about $10^{12}$–$10^{15}$ at/cm$^2$ and at a low energy, within about 20–120 KeV, which forms region 30. Then, while keeping the same masking layer, a second ion-implantation is carried out with ions of the P-type, boron ions, for instance, too, at a lighter dose within about $10^{11}$–$10^{14}$ at/cm$^2$, and at a higher energy within about 120–400 KeV, which forms region 31.

The dose ratio of the first and second implantations is higher than 2, and, preferably, is about 10.

The advantages of this second ion-implantation which is carried out more deeply, is that the radius of curvature $R_{ji}$ of junction 36 is longer than radius $r_{ji}$ of junction 35, and this provides the benefit of an improved breakdown voltage. Indeed, the lines of the electrical flux (shown in 37), contained within the depletion region 38 are approximately parallel, which means that no region is any more sensitive to the reverse voltage. It results therefrom that the junction breakdown voltage is higher.

The first implantation defines the parameters of region 30 whereas the second implantation defines the parameters of region 31 without modifying those of region 30.

This results in a P-type region formed of two portions 30 and 31, in which a resistor can be embedded. In that case, the effective value of the resistor is given by the parallel resistors in the deep and shallow portions, i.e., practically by the resistance of the heavily-doped region 30.

Thus, the first implantation determines the value of the surface resistor ($R_S$) and the (TCR) temperature coefficient thereof and the second implantation defines the position of the resulting junction. Region 31 contains the depletion layer of the resulting junction and determines the breakdown voltage.

Figure 4:
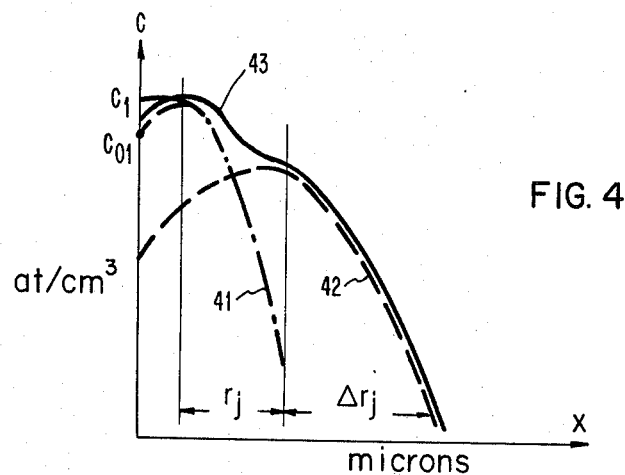
FIG. 4 shows the profiles of the resulting concentration and the concentrating profiles of the two ion-implantations, along line 3-3 of FIG. 3.
Figure 6:
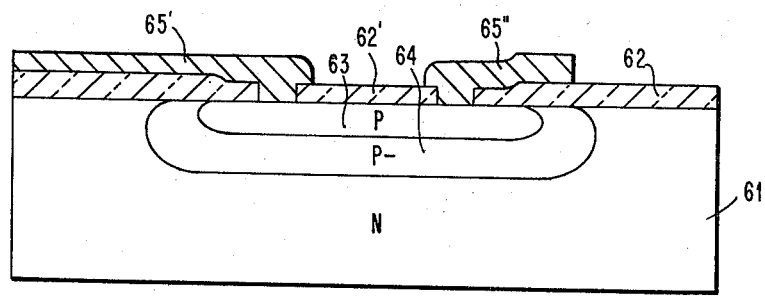
FIG. 6 is a sectional view of the implanted resistor structure according to the teachings of this invention.
Figure 5:
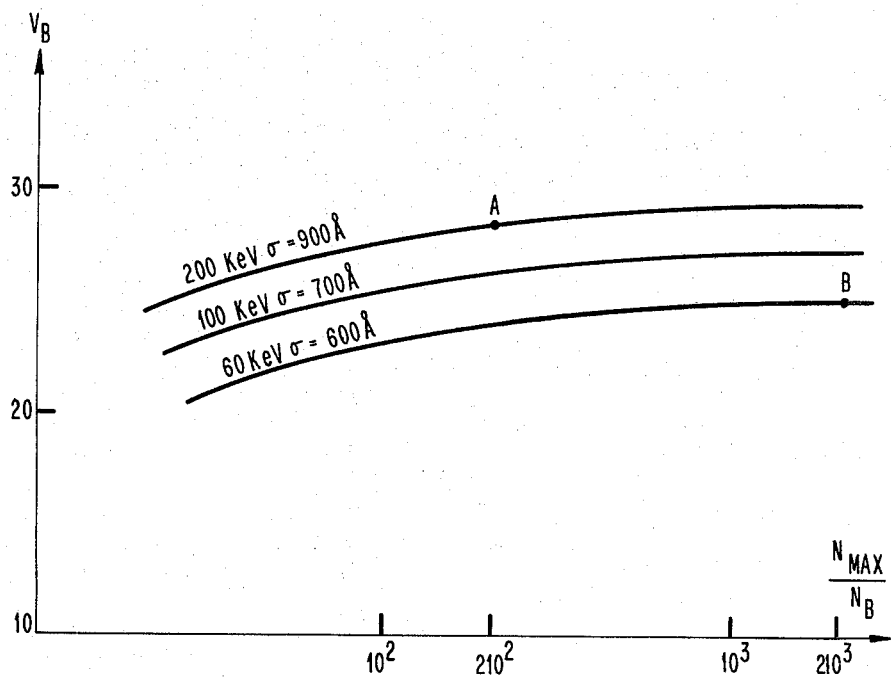
FIGS. 5 and 5A illustrate the curves determined by the breakdown voltage $V_B$ of an implanted junction with respect to the ratio ($N_{MAX}/N_B$) for different values of the implantation energy.
Figure 5A:
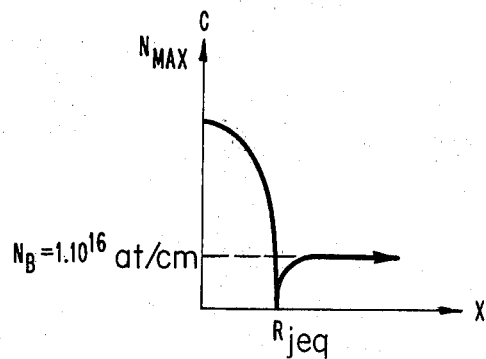

FIG. 4 illustrates the concentration profiles 41 and 42 of the two ion-implantations $I_1$ and $I_2$. Curve 43 illustrates the resulting concentration profile. Since the resistance is determined by the chosen electrical circuit, the operating conditions of the first implantation, therefore, are determined. (They can merely be adjusted with respect to the desired TCR). The second implantation determines the breakdown voltage $V_B$. It may be useful to know the different values of $V_B$ which can be obtained with respect to the implantation parameters (chemical species, dose, implantation energy). It should be advisable that the technician who conceives the circuit have a number of reference curves at his disposal in order to make his choice easier. We shall try to find the basis parameters ($N_{MAX}$, $R_{jeq}$) of a gaussian profile equivalent to that of two implantations $I_1$ and $I_2$ (FIG. 4). To this end, we proceed to the following approximations; the maximal concentration $N_{MAX}=C_1$ is assumed to be the value of the surface concentration for $I_1$ (instead of $C_{01}$). Likewise, we assume that $R_{jeq}=r_j+\Delta r_j$. The equivalent profile is shown in FIG. 5A; of course, it does not correspond perfectly to the exact profile 43 shown in FIG. 5. FIG. 5 illustrates the breakdown voltages of such a junction, which is equivalent to that which would be obtained with a single ion-implantation, with respect to the maximum concentration $N_{MAX}$ - epitaxial layer concentration $N_B$ ratio, for implantation energies within 20 and 200 KeV. The typical variations $\sigma$ from the typical gaussian profile are also illustrated. Therefore, the breakdown voltage is a function of $N_{MAX}$, $N_B$ and $R_{jeq}$. The practical utilization of these curves will be given in the following detailed description relative to the manufacturing process of a resistor according to this invention (FIG. 6).

First, a monocrystalline silicon substrate, not shown, of the P-type (orientation <100>, resistivity 10–20 Ω/cm, is coated with an epitaxial layer 61 of the N-type (resistivity 0.5 Ω/cm, thickness 4 microns, impurity concentration $N_B=1.0\times10^{16}$ at/cm$^3$. This slice is oxidized in a wet atmosphere for a sufficient time (10–30mn) so that a masking layer 62 of SiO2 and 400 Å thick, is grown. After a conventional lithography step, an aperture with the determined configuration is made in this masking layer. The first shallow implantation defines the value of the resistor and the TCR. For instance, in order to obtain a resistor of 600 Ω/□, boron ions are implanted at an energy of 60 KeV and at a heavy dose of $1.4\times10^{14}$ at/cm$^3$. The obtained region 63 is the bed of the resistor having a $R_S$ which is 660 Ω/□ and a TCR which is 1200 ppm/° C. The second implantation defines the breakdown voltage of the resistor; it is carried out at a lighter dose, and at a higher energy in order to define the deeper region 64. It is carried out through the same aperture made in the SiO2 layer. The technician can refer to the curves shown in FIG. 5 for guidance. In order to obtain a breakdown voltage of about 28 volts, he can choose an implantation energy of 200 KeV, a point A that corresponds to ratio $(N_{MAX}/N_B)=2.20^2$ with $N_B=1.0\times10^6$ at/cm$^3$ and $\delta=900$ Å.

Relation $N_{MAX}=$dose$/\delta\sqrt{2\pi}$ makes it possible to determine the lighter dose which is $1.4\times10^{13}$ at/cm$^2$. It can be observed that the dose ratio is 10. The order in which the two implantations are carried out does not matter. In this structure, the breakdown voltage has been 29 V.

These implantations are followed with a thermal annealing step at 1000° for 30′. The annealing step can be carried out at other temperatures and times. For example 900–1050° C. for one minute to several hours. After this annealing step in an oxygen atmosphere, during which a layer 62′ of SiO2 has been developed on the resistor bed, another lithography step makes it possible to make the two apertures for the formation of the contacts. An aluminum layer, then, is deposited through a vacuum evaporation, and then delimited according to the required configuration in order to obtain conductors 65′ and 65″. The resistor, thus, is achieved.

It is obvious that the figures illustrate only a portion of the semiconductor support, or substrate, and that a larger number of resistors implanted according to this invention, can be formed simultaneously, In addition, this double implantation resistor is a part of an integrated circuit which has also active and passive devices, such as transistors, diodes, capacitors, etc. Had we kept only the shallow region 63, according to the prior art, the above-mentioned implantation conditions would have led to point B (FIG. 5) and the resistor would have had a breakdown voltage of about 23 V, only.

Figure 7:
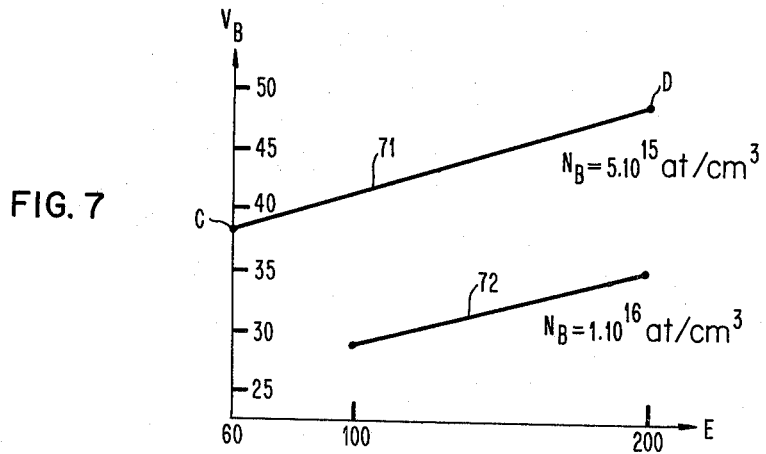
FIG. 7 illustrates the variation in the breakdown voltage $V_B$ with respect to the implantation energy for determined implantation parameters.

FIG. 7 shows off the variations in the breakdown voltage $V_B$ with respect to the energy of the second implantation. Point C of line 71 is representative of the following implantation parameters: energy 60 KeV, heavy dose $1\times10^{14}$ at/cm$^2$, $N_B=5.0\times10^{15}$ at/cm$^3$, the obtained junction has a breakdown voltage $V_B=38$ V. Point D, defined by the following parameters, 200 KeV, $1 \times 10^{13}$ at/cm$^2$, $N_B = 5.0 \times 10^{15}$ at/cm$^3$, defines a junction with $V_B = 48$ V. With the process according to this invention, it is possible to improve the breakdown voltage of this resistor by about 25%. Line 72 is a similar curve with $N_B = 1 \times 10^{16}$ at/cm$^3$.

The deeper resulting junction (6000 Å) is not a problem since the epitaxial layers, at present, are about 1 micron thick.

Thus, with the ever increasing miniaturization of the integrated semiconductor circuits, ion implantation has taken a larger importance, and the devices have become thinner. The result, however, has been the relatively low breakdown voltages of the junctions. This invention remedies this drawback by improving the breakdown voltages of the junctions without adversely affecting the performances thereof. The so-improved junctions can be used in many passive devices (resistors) or active devices (diodes, transistors), more specifically, they can apply to analog circuits, visualization devices, etc.

It is clear that the preceding description has only been given as an unrestrictive example and that numerous alternatives can be envisaged without departing from the spirit and scope of this invention.

We claim:

1. A process of forming an implanted resistor in a semiconductor substrate of a first type of conductivity, comprising the following steps:

implanting a impurity of a second type of conductivity opposite to said first type of conductivity into a region of the substrate, at a first heavy dose within about $10^{12}$–$10^{15}$ at/cm$^2$, at a low energy within about 20–120 KeV in order to define the required value of the resistor and bring about a low TCR, implanting an impurity of said second type of conductivity into said region, at a second dose within about $10^{11}$–$10^{14}$ at/cm$^2$, which is lighter than said heavy dose, and at a higher energy within about 120–400 KeV, in order to ensure an improved breakdown voltage without substantially modifying the required value of the resistor, and annealing the substrate, the ratio of atoms implanted in said heavy dose to the atoms implanted in said lighter dose being at least about 10.

2. A process according to claim 1 in which the lighter dose implantation step is carried out first.

3. A process according to claim 1 in which the impurity chosen for the first and second ion-implantations is boron.

4. A process according to claim 1 in which the annealing step is carried out at a temperature within 900°–1050° for a length of time within 1 minute and several hours.

5. A process according to claim 1 in which the parameters for the first implantation are: boron ions, implantation energy of 60 KeV, dose of $1 \times 10^{14}$ at/cm$^2$, and those for the second implantation are: boron ions, implantation energy of 200 KeV, dose of $1 \times 10^{13}$ at/cm$^2$, and the annealing step is carried out at 1000° during 30 minutes.

* * * * *

UNITED STATES PATENT AND TRADEMARK OFFICE
CERTIFICATE OF CORRECTION

PATENT NO. : 4,298,401
DATED : November 3, 1981
INVENTOR(S) : Nuez et al

It is certified that error appears in the above-identified patent and that said Letters Patent is hereby corrected as shown below:

Column 1, line 31    "filed" should be --field--;
Column 1, line 66    "later" should be --latter--;
Column 2, line 15    "resitors" should be --resistors--;
Column 3, line 3     "defind" should be --defined--;
Column 4, line 19    "borken" should be --broken--;
Column 4, line 25    "1-1" " should be --1-1'--;
Column 6, line 30    "a point" should read --and point--;
Column 6, line 31    "$2.20^2$" should read --$2.10^2$--;
Column 6, line 32    "$\delta$" should be --$\sigma$--;
Column 6, line 33    "$\delta$" should be --$\sigma$--;
Column 7, line 29    "a impurity" should be --an impurity--

Signed and Sealed this

Nineteenth Day of June 1984

[SEAL]

Attest:

GERALD J. MOSSINGHOFF

Attesting Officer    Commissioner of Patents and Trademarks